(12) United States Patent
Kou

(10) Patent No.: US 11,895,765 B2
(45) Date of Patent: Feb. 6, 2024

(54) HYBRID PLASMA SOURCE AND OPERATION METHOD THEREOF

(71) Applicant: Finesse Technology Co., Ltd., Hsinchu County (TW)

(72) Inventor: Chwung-Shan Kou, Hsinchu County (TW)

(73) Assignee: Finesse Technology Co., Ltd., Hsinchu County (TW)

( * ) Notice: Subject to any disclaimer, the term of this patent is extended or adjusted under 35 U.S.C. 154(b) by 55 days.

(21) Appl. No.: 17/686,439

(22) Filed: Mar. 4, 2022

(65) Prior Publication Data

US 2023/0209694 A1 Jun. 29, 2023

(30) Foreign Application Priority Data

Dec. 23, 2021 (TW) ................................. 110148447

(51) Int. Cl.
*H05H 1/46* (2006.01)

(52) U.S. Cl.
CPC ................................. *H05H 1/463* (2021.05)

(58) Field of Classification Search
None
See application file for complete search history.

(56) References Cited

U.S. PATENT DOCUMENTS

| | | | | |
|---|---|---|---|---|
| 3,500,118 A | * | 3/1970 | Anderson | H05B 47/20 331/185 |
| 3,983,021 A | * | 9/1976 | Henis | B01D 53/32 423/213.2 |
| 3,987,334 A | * | 10/1976 | Anderson | H01J 65/042 315/276 |
| 4,180,763 A | * | 12/1979 | Anderson | H01J 65/048 315/344 |
| 4,263,097 A | * | 4/1981 | Ohkawa | H05H 1/12 376/133 |
| 4,431,898 A | * | 2/1984 | Reinberg | H01J 37/32009 156/345.35 |

(Continued)

FOREIGN PATENT DOCUMENTS

| | | |
|---|---|---|
| JP | 2018507514 A | 3/2018 |
| KR | 20200048984 | 5/2020 |

(Continued)

*Primary Examiner* — Srinivas Sathiraju

(57) ABSTRACT

A hybrid plasma source and an operation method thereof, the hybrid plasma source is formed by combining the mechanisms of microwave plasma and transformer coupled plasma for gas dissociation and chemical activation. A reaction chamber of the hybrid plasma source is composed of two microwave resonant chambers and sets of hollow metal tubes, after a high-intensity electric field is generated by the microwave resonant chambers to generate a plasma, a high power and high density plasma generated by the highly-efficient coupling mechanism of the transformer coupled plasma is capable of greatly improving a gas conductance, each set of the hollow metal tubes is driven by each set of ferrite transformer magnetic cores to disperse power, which reduces an energy density of each of the hollow metal tubes and reduces occurrence of plasma entering a contraction mode from a diffusion mode, thereby further improving an operable gas flow rate.

19 Claims, 5 Drawing Sheets

(56) References Cited

U.S. PATENT DOCUMENTS

| | | | | |
|---|---|---|---|---|
| 4,452,679 | A * | 6/1984 | Dunn | C08J 7/123 204/164 |
| 4,469,748 | A * | 9/1984 | Sharma | D06M 10/025 427/322 |
| 4,662,977 | A * | 5/1987 | Motley | G21K 1/14 976/DIG. 437 |
| 5,234,723 | A * | 8/1993 | Babacz | C08J 3/28 427/535 |
| 5,292,370 | A * | 3/1994 | Tsai | H01J 37/32678 118/723 MR |
| 5,726,412 | A * | 3/1998 | Briffod | H01J 37/3266 315/111.41 |
| 5,887,554 | A * | 3/1999 | Cohn | F02B 43/10 123/3 |
| 6,731,531 | B1 * | 5/2004 | Forbes | H10B 12/033 365/185.26 |
| 6,899,054 | B1 * | 5/2005 | Bardos | H01J 37/3266 156/345.43 |
| 7,365,027 | B2 * | 4/2008 | Ahn | C23C 16/45529 257/E21.247 |
| 7,591,989 | B2 * | 9/2009 | Smiljanic | B01J 19/088 977/843 |
| 7,687,409 | B2 * | 3/2010 | Ahn | H01L 21/3142 438/763 |
| 7,741,577 | B2 * | 6/2010 | Kong | H05H 1/30 219/121.36 |
| 8,076,249 | B2 * | 12/2011 | Ahn | H01L 21/28194 438/763 |
| 8,399,365 | B2 * | 3/2013 | Ahn | H01L 21/28194 438/763 |
| 8,536,481 | B2 * | 9/2013 | Kong | H05H 7/00 219/121.52 |
| 8,771,538 | B2 * | 7/2014 | Lubomirsky | H01J 37/32357 315/111.41 |
| 8,866,390 | B2 * | 10/2014 | Choi | H05H 1/46 315/111.41 |
| 8,944,003 | B2 * | 2/2015 | Chen | H05H 1/46 118/723 MR |
| 9,224,580 | B2 * | 12/2015 | Smits | H05H 1/30 |
| 9,230,780 | B2 * | 1/2016 | Cox | H01J 37/165 |
| 9,451,686 | B2 * | 9/2016 | Choi | H05H 1/46 |
| 9,466,469 | B2 * | 10/2016 | Khaja | H01J 37/32357 |
| 9,552,967 | B2 * | 1/2017 | Cox | H01J 37/32541 |
| 9,993,282 | B2 * | 6/2018 | Sheperak | A61N 1/44 |
| 9,997,322 | B2 * | 6/2018 | Kong | H01J 1/02 |
| 10,011,532 | B2 * | 7/2018 | Chen | H01L 21/02274 |
| 10,059,614 | B2 * | 8/2018 | Boughton | C03B 3/026 |
| 10,083,818 | B2 * | 9/2018 | Khaja | H01J 37/32155 |
| 10,934,623 | B2 * | 3/2021 | Zong | B05D 7/52 |
| 10,975,471 | B2 * | 4/2021 | Zong | C23C 16/50 |
| 10,975,472 | B2 * | 4/2021 | Zong | B05D 1/62 |
| 11,041,244 | B2 * | 6/2021 | Zong | B05D 1/62 |
| 11,071,874 | B2 * | 7/2021 | Kang | A61N 1/44 |
| 11,313,039 | B2 * | 4/2022 | Zong | B05D 3/147 |
| 2007/0221331 | A1 * | 9/2007 | Lee | H01L 21/31116 257/E21.252 |
| 2007/0235419 | A1 * | 10/2007 | Kong | H05H 1/30 219/121.36 |
| 2008/0055594 | A1 * | 3/2008 | Hadidi | H05H 1/30 356/316 |
| 2011/0114601 | A1 * | 5/2011 | Lubomirsky | H01J 37/32357 118/723 MP |
| 2012/0090985 | A1 * | 4/2012 | Rabinovich | B01J 19/088 422/186.21 |
| 2013/0154480 | A1 * | 6/2013 | Choi | H05H 1/46 315/111.51 |
| 2013/0171038 | A1 * | 7/2013 | Choi | H01J 37/32669 422/186.03 |
| 2013/0175928 | A1 * | 7/2013 | Choi | H05H 1/46 315/111.41 |
| 2014/0231667 | A1 * | 8/2014 | Smits | H05H 1/46 315/108 |
| 2014/0252953 | A1 * | 9/2014 | Smits | H01J 37/32082 315/111.21 |
| 2014/0303549 | A1 * | 10/2014 | Sheperak | A61N 5/10 604/24 |
| 2015/0170956 | A1 * | 6/2015 | Naik | H01L 21/31116 438/703 |
| 2015/0342020 | A1 * | 11/2015 | Hala | H01J 37/244 315/5.13 |
| 2016/0233055 | A1 * | 8/2016 | Smith | H01J 37/3244 |
| 2016/0244352 | A1 * | 8/2016 | Boughton | C03B 3/026 |
| 2019/0046809 | A1 * | 2/2019 | Kang | H01J 37/32449 |
| 2019/0133669 | A1 * | 5/2019 | Sheperak | A61L 2/007 |
| 2019/0318920 | A1 * | 10/2019 | Katzmann | H01J 49/0031 |
| 2019/0336935 | A1 * | 11/2019 | Kong | C01B 3/02 |
| 2019/0337012 | A1 * | 11/2019 | Zong | B05D 1/62 |
| 2020/0029415 | A1 * | 1/2020 | Sheperak | A61B 18/042 |
| 2022/0088233 | A1 * | 3/2022 | Sheperak | A61N 5/10 |

FOREIGN PATENT DOCUMENTS

| | | |
|---|---|---|
| TW | 201309107 | 2/2013 |
| TW | M628523 U | 6/2022 |
| WO | WO2014007472 A1 | 1/2014 |

* cited by examiner

HYBRID PLASMA SOURCE AND OPERATION METHOD THEREOF

CROSS-REFERENCE TO RELATED APPLICATION

This application claims priority from Taiwan Patent Application No. 110148447, filed on Dec. 23, 2021, in the Taiwan Intellectual Property Office, the content of which are hereby incorporated by reference in their entirety for all purposes.

BACKGROUND OF THE INVENTION

1. Field of Invention

The invention relates to a plasma source, more particularly to a hybrid plasma source and an operation method thereof.

2. Description of the Related Art

Plasma has been widely used in semiconductor manufacturing process and other industrial manufacturing, and its advantage is that it can decompose gas molecules to generate a highly reactive mixture composed of neutral free radicals, ions, atoms, electrons and excited molecules to provide various physical and chemical reactions required for a manufacturing process. There are many different mechanisms for generating plasma, one of which is to use a ferrite transformer magnetic core to generate an inductive coupled plasma discharge. As shown in FIG. 1, the main mechanism is to use a ferrite transformer magnetic core 502 to generate an induced electric field in a toroidal vacuum chamber 500 to cause a gas to discharge. One end of the toroidal vacuum chamber 500 is a gas inlet 506 and another end of the toroidal vacuum chamber 500 is a gas outlet 508. This method is similar to the principle of a transformer, a power supply is connected to a primary side of the ferrite transformer magnetic core 502 and the plasma becomes a secondary side of a single winding, which are connected by magnetic flux to form a superior coupling efficiency. The induced electric field in the plasma drives an electron drift electric current to flow along the toroidal vacuum chamber 500 in a closed path, so the mechanism is also called transformer coupled plasma (TCP). In the conventional technology, although the ferrite transformer magnetic core 502 connecting to a driving AC power source is capable of generating an induced electric field in the toroidal vacuum chamber 500 to excite an electric current in the plasma, an annular ceramic plate 504 must be used in the structure of the toroidal vacuum chamber 500 to provide an electrical barrier area, otherwise the ferrite transformer magnetic core 502 will be short-circuited and the induced electric field cannot be generated in the toroidal vacuum chamber 500. The electrical barrier area must be small enough to be capable of generating an electric field intensity strong enough to excite and maintain a stable plasma. However, under the influence of the metal structure of the toroidal vacuum chamber 500, the strong electric field generated by the ferrite transformer magnetic core 502 will be concentrated in the electrical barrier area formed by the annular ceramic plate 504; sometimes regional discharge is triggered off to cause the annular ceramic plate 504 to rupture to destroy the electrical barrier, and even back discharge is triggered off to damage the driving power supply, or causing the protective coating of the reaction chamber to fall off.

Anderson describes this method in U.S. Pat. Nos. 3,500,118 and 3,987,334. U.S. Pat. No. 4,180,763 discloses the use of ferrite magnetic core TCP for lighting applications. Reinberg et al. in U.S. Pat. No. 4,431,898 discloses the use of plasma to remove light resistance in semiconductor manufacturing process. This TCP technology has been used in plasma sources where a dissociated gas provides a large activation rate. In some applications with high gas pressure and high gas flow, high power density plasma is required to chemically activate a working gas or change the properties or composition of the gas, the chemically activated gas is then sent to a vacuum processing system. Such applications, referred to as "remote plasma processing," comprise: (1) remote chamber cleaning; (2) remote chamber ashing of polymer surfaces; and (3) downstream backing cleaning in vacuum backing pipelines and aftertreatment gas abatement. Many of these applications involve high flow rate (greater than 1 slm) of electronegative plasma discharge gas (e.g., $O_2$, $NF_3$, $SF_6$) and relatively high gas pressure (greater than 1 Torr). Therefore, high power density is generally required to achieve high dissociation and activation requirements of the working gas. Under high pressure and high flow operating conditions, like many inductively coupled plasma source devices, the intensity of the induced electromagnetic field of the TCP is not strong enough to ignite plasma discharge, and plasma discharge must be induced by other means of introducing a high-intensity electric field in the vacuum reaction chamber, such as installing high-voltage electrodes, or introducing a high AC voltage to an electrically isolated part of the chamber to generate a local radio-frequency glow discharge. However, the service life and proper rate of high-voltage discharge devices are limited, for example, it was proposed in documents to add a resonant circuit to the circuit to generate a high voltage (1-10 kV) to effectively generate regional discharge to generate plasma, but if the same voltage is still used after plasma generation, it will generate a very high current and cause damage to the power component. Therefore, a high-voltage relay must be installed on the circuit to make the power circuit quickly turn into a non-resonant circuit after the plasma is generated to reduce the voltage and avoid the damage of high current. However, if the relay fails or the control signal is delayed and the relay cannot be activated immediately, the power component will be damaged. On the other hand, the use of high voltage can easily cause damage to the vacuum chamber insulation component and cause electrical short circuit, and also cause the coating on the chamber wall to fall off and flow into the manufacturing process chamber, resulting in particle pollution. For some applications such as panel display manufacturing, a large amount of gas (>30 slm) must be used to meet the manufacturing process requirements due to the large volume of the process system. Therefore, the operating air pressure and power density must be greatly increased under the structure of the toroidal vacuum chamber in the prior art. However, in this case, the diameter of the cylindrical plasma column in the vacuum chamber becomes smaller due to the limitations of ion and electron collision, ambipolar diffusion and heat dissipation, resulting in the plasma entering a contraction mode from a diffusion mode and cannot fill the vacuum chamber to the fullest, causing part of the gas unable to react by the plasma, and the overall gas activation rate is reduced and cannot meet the manufacturing process requirements. In severe cases, plasma instability even occurs, causing the plasma to fail to maintain and extinguish. Therefore, how to improve the chamber structure of the toroidal vacuum chamber in the prior art to ensure the stability of the plasma is a problem that must be overcome to further improve the gas flow rate.

SUMMARY OF THE INVENTION

In view of the above-mentioned problems of the prior art, an object of the invention is to improve the drawbacks of the above-mentioned existing TCP technology, and to propose a solution for further improving a flow rate of a working gas. The main technology lies in (1) combining the mechanisms of microwave plasma and TCP to form a hybrid plasma source, using two microwave resonant chambers to generate a high-intensity electric field to generate a plasma, and using the highly-efficient energy coupling mechanism of the TCP to generate a high power and high-density plasma; in this way, the drawbacks of the high-voltage ignition device can be eliminated on the one hand, and at the same time, since the microwave is responsible for exciting and maintaining the initial plasma, the drawbacks of the TCP weak electric field can be solved, so as to improve the plasma stability; and (2) a reaction chamber of the hybrid plasma source is composed of two microwave resonant chambers and a plurality of sets of hollow metal tubes, compared with the toroidal vacuum chamber in the prior art, a gas conductance can be greatly improved, so that the gas pressure can be maintained in the range of several Torrs under the condition of large gas flow. At the same time, because a power of each set of the hollow metal tubes is dispersed, an energy density of each of the hollow metal tubes is reduced, and the occurrence of plasma entering a contraction mode from a diffusion mode is reduced.

In order to achieve the foregoing object, the invention discloses a hybrid plasma source comprising: a reaction chamber, the reaction chamber comprising a first microwave resonant chamber, a second microwave resonant chamber and at least one pair of hollow metal tubes, two ends of each of the hollow metal tubes being respectively communicated to the first microwave resonant chamber and the second microwave resonant chamber, wherein at least one microwave is conducted into the reaction chamber, so as to excite a working gas in the reaction chamber into a plasma; and at least one ferrite transformer magnetic core, the ferrite transformer magnetic core comprising a ferrite magnetic core with two hollow areas respectively sleeved on the hollow metal tubes, an induction coil wound around the ferrite magnetic core through the two hollow areas, and a driving power source electrically connected to the induction coil, thereby generating an induced electric field in the hollow metal tubes of the reaction chamber, and the induced electric field exciting the plasma to form an electric current with a closed path in the reaction chamber to further dissociate the working gas to increase a density of the plasma.

Preferably, the electric current circulates through the first microwave resonant chamber, the hollow metal tubes and the second microwave resonant chamber to form the closed path.

Preferably, the hybrid plasma source of the invention further comprises at least one microwave source disposed on the first microwave resonant chamber, or the second microwave resonant chamber, or the first microwave resonant chamber and the second microwave resonant chamber of the reaction chamber for conducting the microwave into the reaction chamber.

Preferably, the microwave source comprises a magnetron, a central metal rod and a cylindrical outer tube disposed coaxially, the central metal rod is located in the cylindrical outer tube, one end of the central metal rod is connected to an output antenna of the magnetron, another end of the central metal rod extends into the reaction chamber, so that the microwave generated by the magnetron is conducted into the reaction chamber through the central metal rod and the cylindrical outer tube.

Preferably, the microwave source further comprises a microwave matching element for reducing a reflection amount of the microwave generated by the magnetron when being conducted into the reaction chamber through the central metal rod and the cylindrical outer tube, so that the microwave is capable of entering the reaction chamber.

Preferably, the microwave matching element comprises a metal coaxial tube disposed transversely on the cylindrical outer tube, wherein the metal coaxial tube has a transverse tube, a metal plate, and a transverse bar disposed coaxially, the transverse tube is transversely disposed on the cylindrical outer tube, the transverse bar extends from the cylindrical outer tube into the transverse tube, and the metal plate is disposed on the transverse bar.

Preferably, the metal plate is movably disposed on the transverse bar to improve the reflection amount of the microwave by performing impedance matching.

Preferably, a diameter gradient area is provided between the output antenna and the central metal rod, so as to reduce a reflection amount of the microwave generated by the magnetron when being conducted from the output antenna to the central metal rod.

Preferably, the cylindrical outer tube is a ceramic tube or a closed vacuum tube.

Preferably, the two ends of each of the hollow metal tubes are respectively communicated to the first microwave resonant chamber and the second microwave resonant chamber through at least one electrical barrier area, so as to prevent a short circuit from occurring between the reaction chamber and the ferrite transformer magnetic core.

Preferably, the electrical barrier area is an annular ceramic plate.

Preferably, the first microwave resonant chamber and the second microwave resonant chamber are hollow cylinders.

Preferably, a gas pressure of the working gas is greater than 1 Torr, and a gas flow rate of the working gas is greater than 10 slm.

Preferably, a quantity and/or a tube diameter of the hollow metal tubes are/is increased corresponding to an increase in a flow rate of the working gas, thereby ensuring a stability of the plasma in the hollow metal tubes and increasing a gas conductance.

Preferably, a power density of the plasma corresponds to a quantity of the hollow metal tubes.

Preferably, a quantity of the ferrite transformer magnetic core is two sets, and the induction coils are connected to the driving power source in parallel to supply electric power.

Preferably, an electric field generated by the ferrite transformer magnetic cores is perpendicular to a central metal rod that conducts the microwave into the reaction chamber to avoid interference with a microwave source that generates the microwave.

Preferably, the driving power source is an alternating current power source, a direct current power source or a pulse power source.

Preferably, the first microwave resonant chamber has a gas inlet, and the second microwave resonant chamber has a gas outlet.

Further, the invention also discloses an operation method of the hybrid plasma source, characterized in that a microwave electric field is used to cause the working gas form the plasma, and then a transformer coupled plasma technique is used to couple energy to the plasma with high efficiency, so that a plasma density of the plasma is further increased to generate an activated gas with a high degree of dissociation.

In summary, the hybrid plasma source and the operation method thereof of the invention have the following advantages: (1) combining the mechanisms of microwave plasma and TCP to form the hybrid plasma source; (2) using the two microwave resonant chambers to generate a high-intensity electric field to generate a plasma, and using the highly-efficient energy coupling mechanism of the TCP to generate the high power and high-density plasma; (3) the drawbacks of the high-voltage ignition device can be eliminated, and at the same time, since the microwave is responsible for exciting and maintaining the initial plasma, the drawbacks of the TCP weak electric field can be solved, so as to improve the plasma stability; (4) by utilizing the characteristics of the strong electric field of the reaction chamber, a certain plasma density can still be maintained even during adjustment in the manufacturing process conditions, even if the gas pressure is 1 Torr to 10 Torr, the high-intensity electric field can still be effectively excited to meet the requirements of stable generation of plasma; (5) according to a flow rate of the working gas, a quantity of sets of the hollow metal tubes can be increased to disperse the flow rate, which can not only ensure the stability of the plasma, but also increase a gas conductance; (6) since the plasma of the invention has been excited by the microwave, the electrical barrier areas of the invention can be wider, which is conducive to prolonging the service life and the stability of the system; (7) the gas pressure can be maintained in a range of several Torr under the condition of large gas flow; (8) because a power of each set of the hollow metal tubes is dispersed, an energy density of each of the hollow metal tubes is reduced, and the occurrence of plasma entering a contraction mode from a diffusion mode is reduced; and (9) the invention utilizes the high-intensity electric field in the reaction chamber to excite a stable plasma to provide sufficient free electrons under high gas pressure and high gas flow rate, the free electrons are then driven and accelerated by the electric field induced and generated by the ferrite transformer magnetic core to form the closed-path electron drift electric current in the reaction chamber, and to further dissociate the working gas effectively to generate the high density plasma.

DETAILED DESCRIPTION OF THE INVENTION

Figure 1:
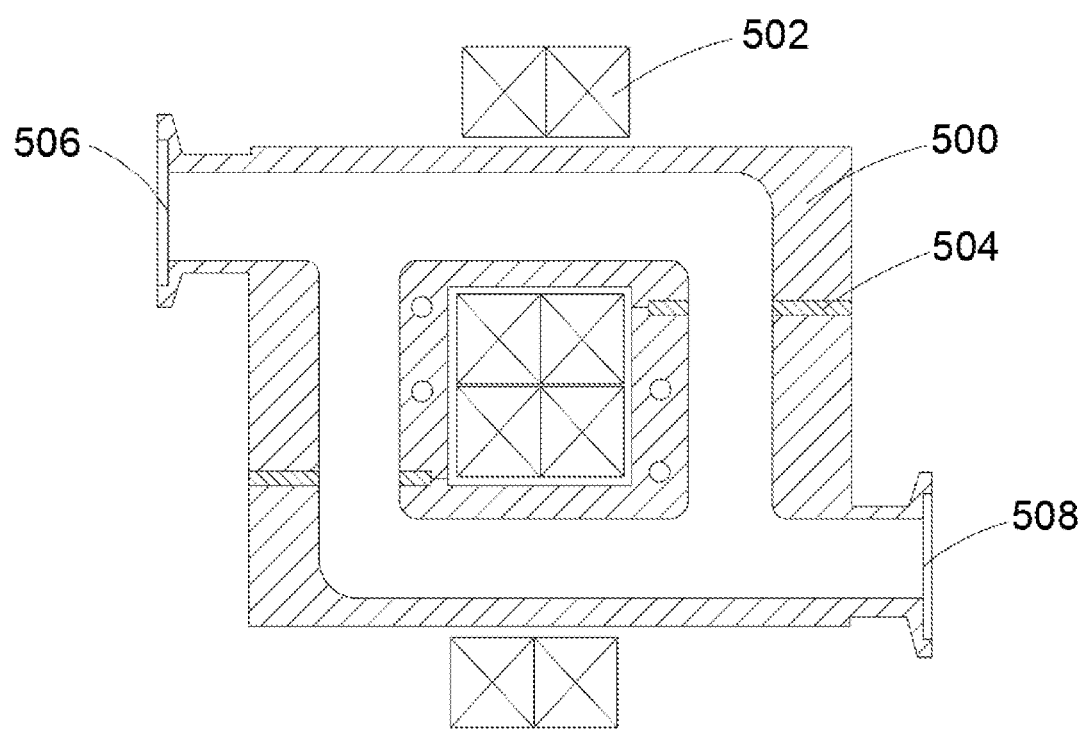
FIG. 1 is a cross-sectional view of a toroidal vacuum chamber of a conventional toroidal low electric field plasma source.

In order to understand the technical features, content and advantages of the invention and its achievable efficacies, the invention is described below in detail in conjunction with the figures, and in the form of embodiments, the figures used herein are only for a purpose of schematically supplementing the specification, and may not be true proportions and precise configurations after implementation of the invention; and therefore, relationship between the proportions and configurations of the attached figures should not be interpreted to limit the scope of the claims of the invention in actual implementation. In addition, in order to facilitate understanding, the same elements in the following embodiments are indicated by the same referenced numbers. And the size and proportions of the components shown in the drawings are for the purpose of explaining the components and their structures only and are not intending to be limiting.

Unless otherwise noted, all terms used in the whole descriptions and claims shall have their common meaning in the related field in the descriptions disclosed herein and in other special descriptions. Some terms used to describe in the present invention will be defined below or in other parts of the descriptions as an extra guidance for those skilled in the art to understand the descriptions of the present invention.

The terms such as "first", "second", "third" used in the descriptions are not indicating an order or sequence, and are not intending to limit the scope of the present invention. They are used only for differentiation of components or operations described by the same terms.

Moreover, the terms "comprising", "including", "having", and "with" used in the descriptions are all open terms and have the meaning of "comprising but not limited to".

The invention discloses a hybrid plasma source and an operation method thereof, the hybrid plasma source is formed by combining microwave plasma and transformer coupled plasma (TCP) technologies for dissociation and chemical activation of a working gas, and the method is capable of generating a high power and high density plasma at high pressure and gas flow rate. In the invention, a microwave is used to generate a high-intensity electric field (microwave electric field) in microwave resonant chambers to cause the working gas form a plasma, and then the transformer coupled plasma technology is used to effectively couple the energy, so that the plasma discharge generates an electron drift electric current, and further effectively dissociates the working gas to generate the high power and high density plasma.

Figure 2:
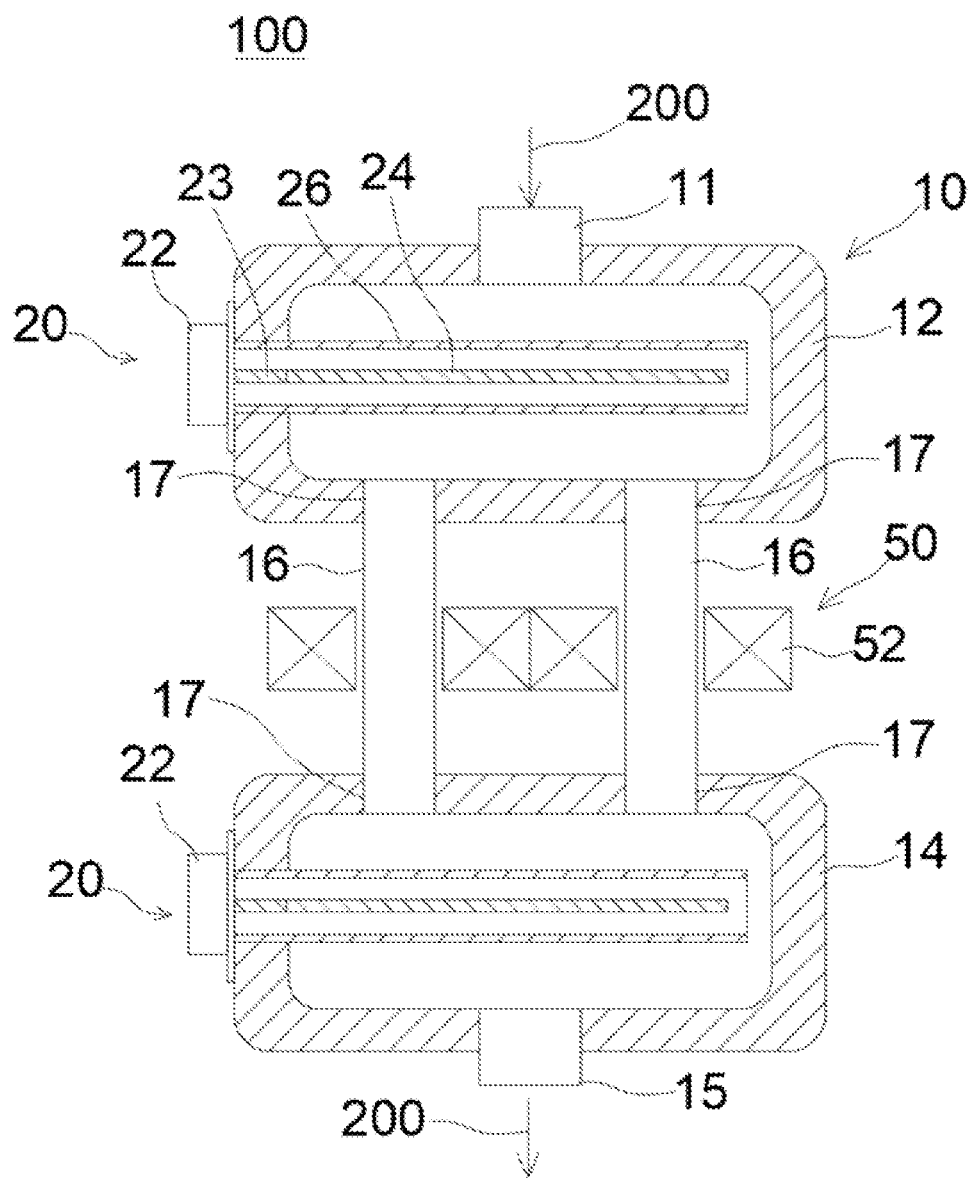
FIG. 2 is a cross-sectional view of a hybrid plasma source of the invention.

Please refer to FIGS. 2 to 5, the invention discloses a hybrid plasma source 100 comprising a reaction chamber 10 and at least one ferrite transformer magnetic core 50. The reaction chamber 10 comprises a first microwave resonant chamber 12, a second microwave resonant chamber 14 and at least one paired hollow metal tubes 16. Two ends of each of the hollow metal tubes 16 are respectively communicated to the first microwave resonant chamber 12 and the second microwave resonant chamber 14, wherein the reaction chamber 10 first uses a microwave to cause a working gas 200 form a plasma, and the ferrite transformer magnetic core 50 generates an induced electric field 400 (which is a TCP induced electric field) used to excite the plasma to make the plasma to discharge to generate an electric current. As shown in FIG. 2, the first microwave resonant chamber 12 and the second microwave resonant chamber 14 are, for example, hollow cylinders lying horizontally, and the paired hollow metal tubes 16 are respectively communicated to cylindrical bodies of the first microwave resonant chamber 12 and the second microwave resonant chamber 14 and are spaced apart from each other by a distance. The ferrite transformer magnetic core 50 comprises a ferrite magnetic core 52, an induction coil 56 and a driving power source 58. The ferrite magnetic core 52 has at least two hollow areas 54 respectively sleeved on the paired hollow metal tubes 16 of the reaction chamber 10. The ferrite magnetic core 52 is, for example, configured in the shape of "two quadrangles connecting with each other", which is similar to the letter "Θ" in the Greek alphabet. The induction coil 56 is wound around the ferrite magnetic core 52 by using the two hollow areas 54, for example, wound on a middle crossbar of the "Θ"-shaped ferrite magnetic core 52, and the driving power source 58 is electrically connected to two ends of the induction coil 56, for example, through wires, in order to generate the induced electric field 400 in the reaction chamber 10 (e.g., in the hollow metal tubes 16). The induced electric field 400 is capable of exciting a stable plasma to provide sufficient free electrons, the free electrons are then driven and accelerated by an electric field induced and generated by the ferrite magnetic core 52, so that a closed-path electric current (e.g., electron drift electric current) can be formed in the reaction chamber 10, and the working gas 200 can be further dissociated effectively to generate the high density plasma. The electron drift electric current circulates through the first microwave resonant chamber 12, the hollow metal tubes 16 and the second microwave resonant chamber 14 in the reaction chamber 10 to form a closed path, thereby further dissociating the working gas 200 to increase a density of the plasma. Wherein a type of the working gas 200 of the invention is not particularly limited, any gas is applicable for using as the working gas 200 of the invention as long as it can be used to generate a plasma. A size of the reaction chamber 10 and a distance between the hollow metal tubes 16 and a diameter of the hollow metal tubes 16 can be determined according to actual requirements, and are not limited to the above examples.

The hybrid plasma source 100 of the invention utilizes the high-intensity electric field in the first microwave resonant chamber 12 and the second microwave resonant chamber 14 of the reaction chamber 10 to excite a stable plasma to provide sufficient free electrons under high gas pressure and high gas flow rate (gas pressure>1 Torr, gas flow rate>1 slm), the free electrons are then driven and accelerated by the electric field induced and generated by the ferrite transformer magnetic core 50 to form the closed-path electron drift electric current in the reaction chamber 10, and to further dissociate the working gas 200 effectively to generate the high density plasma. Although the technology of transformer coupling is capable of transferring energy into a plasma very efficiently, like many inductively coupled plasma devices, an intensity (10 V/cm) of an induced electromagnetic field is not enough to break down the working gas 200, especially under high gas pressure and high gas flow rate. Although a high-voltage device can be used to generate an initial discharge in the reaction chamber 10 (vacuum chamber) to achieve an object of generating a plasma, the service life and proper rate of the high-voltage discharge device are limited, and it is extremely easy to cause damage to the chambers of the reaction chamber 10. In particular, transformer coupled plasma (TCP) is a mechanism of low electric field intensity, when a gas pressure or a gas flow is disturbed, it is extremely easy to cause the plasma to become unstable or even extinguished, such as when changing a working gas flow rate in a manufacturing process. In the invention, by utilizing the characteristics of a strong microwave electric field 300 of the first microwave resonant chamber 12 and the second microwave resonant chamber 14 of the reaction chamber 10, a certain plasma density can still be maintained even during adjustment in the manufacturing process conditions, so the above-mentioned drawback can be overcome.

On the other hand, under high pressure, high flow rate and power density, due to the collision of ions and electrons and the limitation of ambipolar diffusion, it is extremely easy to cause contraction of the cylindrical plasma column in the toroidal vacuum chamber of the prior art, resulting in the plasma being incapable of filling the vacuum chamber to the fullest, and even causing unstable plasma, and the power density, gas pressure and gas flow that can be endured by a single metal tube in the toroidal vacuum chamber of the prior art are limited. In contrast, the invention uses a combination of the larger first microwave resonant chamber 12 and second microwave resonant chamber 14 and a plurality of sets of the hollow metal tubes 16 to disperse a flow rate of the working gas 200, and at the same time to reduce a power density in each of the hollow metal tubes 16 by means of the grouping power source to achieve an object of high-pressure and high-flow rate operation.

In detail, one side of the first microwave resonant chamber 12 has a gas inlet 11 for introducing the working gas 200, one side of the second microwave resonant chamber 14 has a gas outlet 15 for exporting the working gas 200, disposing positions of the gas inlet 11 and the gas outlet 15 are, for example, located on opposite far sides of the first microwave resonant chamber 12 and the second microwave resonant chamber 14, respectively. The first microwave resonant chamber 12 and the second microwave resonant chamber 14 are hollow cylinders. The hollow metal tubes 16 are preferably disposed in pairs, so that the working gas 200 can flow through the hollow metal tubes 16 symmetrically, wherein a quantity of the hollow metal tubes 16 can be one pair, or two or more than two pairs, for example; preferably, the hollow metal tubes 16 are separated from each other by a distance. Two ends of each of the hollow metal tubes 16 are respectively communicated to opposite close sides of the first microwave resonant chamber 12 and the second microwave resonant chamber 14, for example. Since many applications involve the generation of high-flow corrosive activated particles (e.g., $NF_3$, $SF_6$ plasma), an interior of the metal reaction chamber 10 must be protected, so the invention can optionally anodize the aluminum reaction chamber 10 (including the first microwave resonant chamber 12, the second microwave resonant chamber 14 and the hollow metal tubes 16) to form a protective film.

Figure 5:
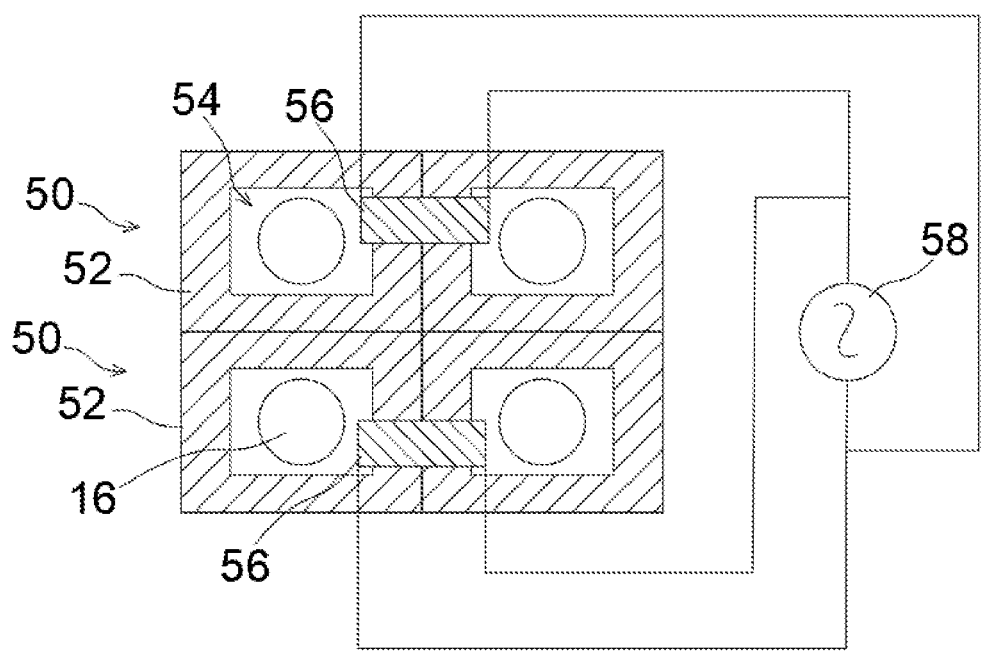
FIG. 5 is a cross-sectional view of a ferrite transformer magnetic core of the hybrid plasma source of the invention.

The invention further comprises at least one microwave source 20 for generating a microwave, and conducting the microwave into the reaction chamber 10, with a resonance frequency of 2.45 GH, a power, for example, between 800 W and 1000 W, and a resonance mode of $TE_{111}$, the working gas 200 in the reaction chamber 10 is excited into a plasma by the high-intensity microwave electric field 300 of the first microwave resonant chamber 12 and the second microwave resonant chamber 14. Wherein, a quantity of the microwave source 20 can be one to be disposed on the first microwave resonant chamber 12 or the second microwave resonant chamber 14 of the reaction chamber 10, for example, on a side (as shown in FIG. 2) or a top side, and a conduction direction of the microwave generated by the microwave source 20 is preferably perpendicular to a disposing direction of the hollow metal tubes 16. In addition, a quantity of the microwave source 20 can also be, for example, two or more than two, so as to be disposed on the first microwave resonant chamber 12 and the second microwave resonant chamber 14 of the reaction chamber 10 at the same time. As shown in FIG. 5, the invention uses the four hollow metal tubes 16 and the two microwave sources 20 as an example, but is not limited thereto. Furthermore, since a quantity of the hollow areas 54 of the ferrite magnetic core 52 corresponds to that of the hollow metal tubes 16, the invention uses two sets of the ferrite transformer magnetic cores 50 as an example, which are configured in the shape of "four quadrangles connecting with each other", wherein the two induction coils 56 of two sets of the ferrite transformer magnetic cores 50 are respectively wound around the two ferrite magnetic cores 52 by using two pairs of the hollow areas 54, and the two induction coils 56 are electrically connected to the driving power source 58 in parallel, for example, to supply electric power to the induction coils 56.

Figure 4:
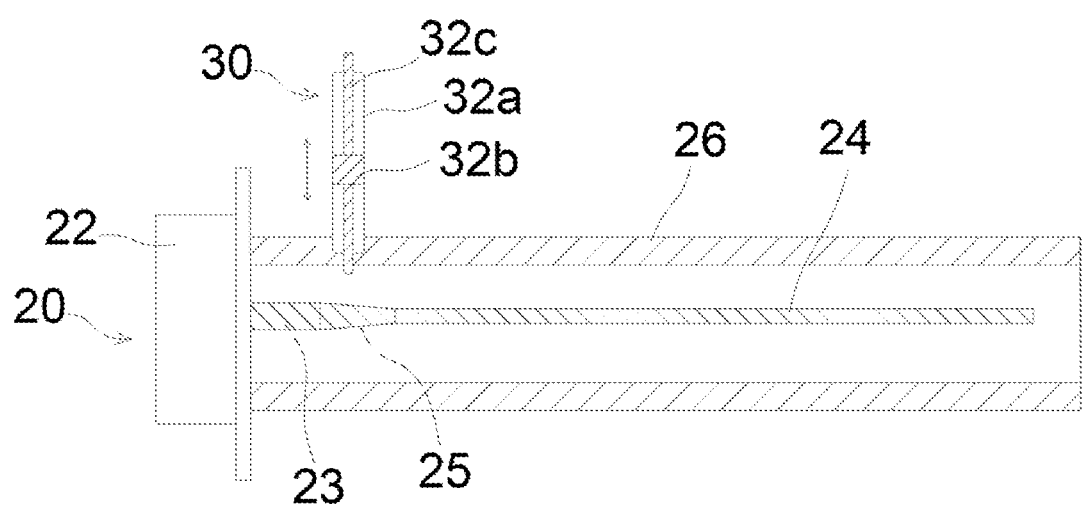
FIG. 4 is a cross-sectional view of a microwave source of the hybrid plasma source of the invention.

In detail, as shown in FIG. 4, the microwave source 20 of the invention is, for example, a coaxial magnetron microwave source comprising a magnetron 22, a central metal rod 24 and a cylindrical outer tube 26 disposed coaxially. The magnetron 22 is disposed on the reaction chamber 10, one end of the central metal rod 24 is connected to an output antenna 23 of the magnetron 22, another end of the central metal rod 24 extends into the reaction chamber 10, and the central metal rod 24 is located in the cylindrical outer tube 26, thereby a microwave generated by the magnetron 22 can be conducted into the reaction chamber 10 through the central metal rod 24 and the cylindrical outer tube 26. Wherein the cylindrical outer tube 26 is preferably a closed vacuum tube, which is capable of preventing the plasma from directly contacting the central metal rod 24 in addition to maintaining a vacuum, and its material can be, for example, ceramic, preferably alumina ceramic. Diameters of the output antenna 23 and the central metal rod 24, for example, can be the same. In addition, if the diameters of the output antenna 23 and the central metal rod 24 are different, for example, one has a larger diameter and the other has a smaller diameter, a diameter gradient area 25 with one end having a larger diameter and another end having a smaller diameter can be optionally provided between the output antenna 23 and the central metal rod 24 in the invention, so as to reduce a reflection amount of the microwave generated by the magnetron 22 when being conducted from the output antenna 23 to the central metal rod 24. Wherein the diameter gradient area 25 can be located on an end portion of the output antenna 23 or on an end portion of the central metal rod 24, as long as an effect of reducing microwave reflection can be achieved, any location can be applied to the invention.

In addition, the microwave source 20 used in the invention can optionally comprise a microwave matching element 30 to reduce a reflection amount of the microwave generated by the magnetron 22 when being conducted into the reaction chamber 10 through the central metal rod 24 and the cylindrical outer tube 26, so that the microwave can be effectively conducted into the reaction chamber 10. The microwave matching element 30 comprises, for example, a metal coaxial tube disposed transversely on the cylindrical outer tube 26, wherein the metal coaxial tube has a transverse tube 32a, a metal plate 32b, and a transverse bar 32c disposed coaxially, the transverse tube 32a is transversely disposed on the cylindrical outer tube 26, the transverse bar 32c extends from the cylindrical outer tube 26 into the transverse tube 32a, and the metal plate 32b is disposed on the transverse bar 32c. Wherein the metal plate 32b is movably disposed on the transverse bar 32c, by adjusting a position of the metal plate 32b for impedance matching, a reflection amount of the microwave can be improved, so that the microwave can be effectively conducted into the first microwave resonant chamber 12 and the second microwave resonant chamber 14 of the reaction chamber 10. Quality factors of the first microwave resonant chamber 12 and the second microwave resonant chamber 14 can exceed 2,000, so a high-intensity electric field can be effectively excited to meet the requirement of stably generating plasma at a gas pressure of 1 Torr to 5 Torr. On the other hand, in general, a collision frequency of free electrons and neutral gas molecules is about several GHz/Torr, and this collision frequency is close to the microwave frequency of 2.45 GHz in a pressure range of several Torr, and thus it is conducive to excitation of plasma by the microwave in a pressure range above 1 Torr.

As shown in FIG. 2, the first microwave resonant chamber 12 and the second microwave resonant chamber 14 of the reaction chamber 10 are communicated with each other via the hollow metal tubes 16, a tube diameter of each of the hollow metal tubes 16 is, for example, 2.5 cm, and a quantity and/or a tube diameter of the hollow metal tubes 16 can be increased corresponding to an increase in a flow rate of the working gas 200. That is, according to a flow rate of the working gas 200, the invention can increase a quantity of sets of the hollow metal tubes 16 to disperse the flow rate, which can not only ensure the stability of the plasma in the hollow metal tubes 16, but also increase a gas conductance, at the same time, a diameter of the gas outlet 15 of the reaction chamber 10 can be increased to 5 cm, which is smaller than a cut-off diameter of the 2.45 GHz microwave, and the microwave cannot be transmitted, which has little effect on the characteristics of the second microwave resonant chamber 14. However, compared with the 2.5 cm in the prior art, an air conductance of the system of the invention is greatly increased, thereby reducing a pressure of the reaction chamber 10, which is conducive to an efficiency of the first microwave resonant chamber 12 and the second microwave resonant chamber 14 to excite a plasma with a high gas flow rate. In addition, the hollow metal tubes 16 are capable of constructively increasing a power density in the hollow metal tubes 16, the first microwave resonant chamber 12 and the second microwave resonant chamber 14, that is, a power density of the plasma corresponds to a quantity of the hollow metal tubes 16 in order to realize a very high density plasma state under relatively high vacuum pressure and high gas flow rate (>1 Torr, >10 slm) and to achieve a function of activating gas.

Figure 3:
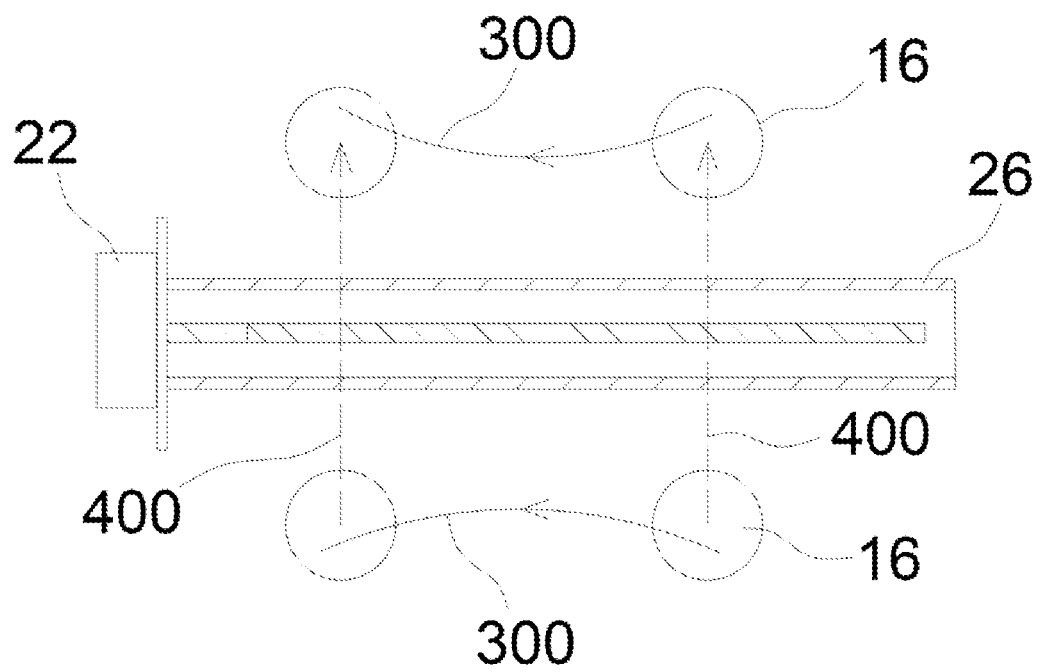
FIG. 3 is a schematic view of an operation of the hybrid plasma source of the invention from another perspective.

Furthermore, as shown in FIGS. 3 and 5, the set of hollow metal tubes 16 pass through the paired hollow areas 54 of the ferrite magnetic core 52 of the ferrite transformer magnetic core 50. The ferrite transformer magnetic core 50 is connected to the AC driving power source 58 to generate the induced electric field 400 in the reaction chamber 10 to excite an electric current in the plasma. However, the structure of the reaction chamber 10 must be electrically isolated, otherwise the ferrite transformer magnetic core 50 will be short-circuited and the induced electric field 400 cannot be generated in the reaction chamber 10. In the invention, this electrical barrier is achieved by using an annular ceramic plate at connections between the hollow metal tubes 16 and the first microwave resonant chamber 12 and the second microwave resonant chamber 14. Under the influence of the metal structure of the reaction chamber 10, an electric field excited by the ferrite transformer magnetic core 50 will be concentrated in electrical barrier areas 17 formed by the annular ceramic plate. In the conventional technology, the electrical barrier area must be small enough to be capable of generating an electric field intensity strong enough to excite and maintain a stable plasma. However, the strong electric field sometimes will trigger off regional discharge to cause the annular ceramic plate to rupture to destroy the electrical barrier, and even will trigger off back discharge to damage the driving power source, or causing the protective coating of the reaction chamber to fall off. In contrast, since the plasma of the invention has been excited by the first microwave resonant chamber 12 and the second microwave resonant chamber 14, an electric field intensity of the electrical barrier areas 17 is not a key parameter, so the electrical barrier areas 17 of the invention can be wider, thus reducing the drawbacks of the above-mentioned conventional technology, which is conducive to prolonging the service life and the stability of the system.

As shown in FIG. 5, the invention can also employ a plurality of the hollow metal tubes 16 and two or more than two of the correlated ferrite magnetic core 52, the ferrite magnetic cores 52 are connected in parallel with a separate primary current source (i.e., the driving power source 58) to supply electric power to support the induced electron drift electric current of the plasma in the hollow metal tubes 16. FIG. 5 shows how the induced electron drift electric current of the plasma in the hollow metal tubes 16 work collaboratively in the plasma of the reaction chamber 10 (the first microwave resonant chamber 12, the second microwave resonant chamber 14 and the hollow metal tubes 16). On the other hand, since an electric field induced and generated by the ferrite transformer magnetic core 50 has a 90-degree relationship with the central metal rod 24 inserted into the reaction chamber 10, it does not interfere with the microwave source 20.

FIG. 5 further shows a power supply circuit for driving the TCP of the invention, wherein the power supply circuit is composed of the driving power source 58, the ferrite transformer magnetic core 50 and a plasma. The invention uses the driving power source 58 being an the AC power supply as an example, a frequency of the AC power supply used is appropriately selected according to a withstand voltage and a withstand current of the driving plasma and the power component and a loss of the ferrite magnetic core 52, which is approximately between 100 kHz and 500 kHz. The AC power supply can be operated at constant power or constant current, with an output voltage of about 250 V to 350 V, and a maximum power of 10 kW. In the prior art, a load impedance of the AC power supply varies greatly from low-density plasma to stable high-density plasma in the process of plasma excitation, posing great challenges to the power component. In contrast, in the invention, since the plasma with a certain density has been excited by the first microwave resonant chamber 12 and the second microwave resonant chamber 14 in an initial stage, dynamic changes of the load impedance can be greatly reduced, and a probability of problems occurring in the power component can be reduced. In addition, the driving power source 58 of the microwave source 20 of the invention can be DC or pulsed, for example, a voltage can be boosted to about 1 kV by a switching circuit through a high-voltage transformer, and then the magnetron 22 can be driven through a piezoelectric doubler circuit with an operating power of 50 W-1000 W. According to the specifications of the currently available magnetron, it can withstand almost total reflection, so it is conducive to excite an initial plasma.

In summary, the hybrid plasma source and the operation method thereof of the invention have the following advantages: (1) combining the mechanisms of microwave plasma and TCP to form the hybrid plasma source; (2) using the two microwave resonant chambers to generate a high-intensity electric field to generate a plasma, and using the highly-efficient energy coupling mechanism of the TCP to generate the high power and high-density plasma; (3) the drawbacks of the high-voltage ignition device can be eliminated, and at the same time, since the microwave is responsible for exciting and maintaining the initial plasma, the drawbacks of the TCP weak electric field can be solved, so as to improve the plasma stability; (4) by utilizing the characteristics of the strong electric field of the reaction chamber, a certain plasma density can still be maintained even during adjustment in the manufacturing process conditions, even if the gas pressure is 1 Torr to 10 Torr, the high-intensity electric field can still be effectively excited to meet the requirements of stable generation of plasma; (5) according to a flow rate of the working gas, a quantity of sets of the hollow metal tubes can be increased to disperse the flow rate, which can not only ensure the stability of the plasma, but also increase a gas conductance; (6) since the plasma of the invention has been excited by the microwave, the electrical barrier areas of the invention can be wider, which is conducive to prolonging the service life and the stability of the system; (7) the gas pressure can be maintained in a range of several Torr under the condition of large gas flow; (8) because a power of each set of the hollow metal tubes is dispersed, an energy density of each of the hollow metal tubes is reduced, and the occurrence of plasma entering a contraction mode from a diffusion mode is reduced; and (9) the invention utilizes the high-intensity electric field in the reaction chamber to excite a stable plasma to provide sufficient free electrons under high gas pressure and high gas flow rate, the free electrons are then driven and accelerated by the electric field induced and generated by the ferrite transformer magnetic core to form the closed-path electron drift electric current in the reaction chamber, and to further dissociate the working gas effectively to generate the high density plasma.

Note that the specification relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A hybrid plasma source comprising:
    at least one microwave source for generating at least one microwave, the microwave source comprising a magnetron, a central metal rod and a cylindrical outer tube disposed coaxially, the central metal rod is located in the cylindrical outer tube;
    a reaction chamber, the reaction chamber comprising a first microwave resonant chamber, a second microwave resonant chamber and at least one pair of hollow metal tubes, two ends of each of the hollow metal tubes being respectively communicated to the first microwave resonant chamber and the second microwave resonant chamber, wherein one end of the central metal rod of the microwave source is connected to an output antenna of the magnetron, another end of the central metal rod of the microwave source extends into the reaction chamber, and the microwave generated by the magnetron is conducted into the reaction chamber through the central metal rod and the cylindrical outer tube, so as to excite a working gas in the reaction chamber into a plasma; and
    at least one ferrite transformer magnetic core, the ferrite transformer magnetic core comprising a ferrite magnetic core with two hollow areas respectively sleeved on the hollow metal tubes, an induction coil wound around the ferrite magnetic core through the two hollow areas, and a driving power source electrically connected to the induction coil, thereby generating an induced electric field in the hollow metal tubes of the reaction chamber, and the induced electric field exciting the plasma to form an electric current with a closed path in the reaction chamber to further dissociate the working gas to increase a density of the plasma.

2. The hybrid plasma source as claimed in claim 1, wherein the electric current circulates through the first microwave resonant chamber, the hollow metal tubes and the second microwave resonant chamber to form the closed path.

3. The hybrid plasma source as claimed in claim 1, wherein the microwave source disposed on the first microwave resonant chamber, or the second microwave resonant chamber, or the first microwave resonant chamber and the second microwave resonant chamber of the reaction chamber for conducting the microwave into the reaction chamber.

4. The hybrid plasma source as claimed in claim 1, wherein the microwave source further comprises a microwave matching element for reducing a reflection amount of the microwave generated by the magnetron when being conducted into the reaction chamber through the central metal rod and the cylindrical outer tube, so that the microwave is capable of entering the reaction chamber.

5. The hybrid plasma source as claimed in claim 4, wherein the microwave matching element comprises a metal coaxial tube disposed transversely on the cylindrical outer tube, wherein the metal coaxial tube has a transverse tube, a metal plate, and a transverse bar disposed coaxially, the transverse tube is transversely disposed on the cylindrical outer tube, the transverse bar extends from the cylindrical outer tube into the transverse tube, and the metal plate is disposed on the transverse bar.

6. The hybrid plasma source as claimed in claim 5, wherein the metal plate is movably disposed on the transverse bar to improve the reflection amount of the microwave by performing impedance matching.

7. The hybrid plasma source as claimed in claim 1, wherein a diameter gradient area is provided between the output antenna and the central metal rod, so as to reduce a reflection amount of the microwave generated by the magnetron when being conducted from the output antenna to the central metal rod.

8. The hybrid plasma source as claimed in claim 1, wherein the cylindrical outer tube is a ceramic tube.

9. The hybrid plasma source as claimed in claim 1, wherein the cylindrical outer tube is a closed vacuum tube.

10. The hybrid plasma source as claimed in claim 1, wherein the two ends of each of the hollow metal tubes are respectively communicated to the first microwave resonant chamber and the second microwave resonant chamber through at least one electrical barrier area, so as to prevent a short circuit from occurring between the reaction chamber and the ferrite transformer magnetic core.

11. The hybrid plasma source as claimed in claim 10, wherein the electrical barrier area is an annular ceramic plate.

12. The hybrid plasma source as claimed in claim 1, wherein the first microwave resonant chamber and the second microwave resonant chamber are hollow cylinders.

13. The hybrid plasma source as claimed in claim 1, wherein a gas pressure of the working gas is greater than 1 Torr, and a gas flow rate of the working gas is greater than 10 slm.

14. The hybrid plasma source as claimed in claim 1, wherein a quantity and/or a tube diameter of the hollow metal tubes are/is increased corresponding to an increase in a flow rate of the working gas, thereby ensuring a stability of the plasma in the hollow metal tubes and increasing a gas conductance.

15. The hybrid plasma source as claimed in claim 1, wherein a power density of the plasma corresponds to a quantity of the hollow metal tubes.

16. The hybrid plasma source as claimed in claim 1, wherein a quantity of the ferrite transformer magnetic core is two sets, and the induction coils are connected to the driving power source in parallel to supply electric power.

17. The hybrid plasma source as claimed in claim 1, wherein an electric field generated by the ferrite transformer magnetic core is perpendicular to the central metal rod that conducts the microwave into the reaction chamber to avoid interference with the microwave source that generates the microwave.

18. The hybrid plasma source as claimed in claim 1, wherein the first microwave resonant chamber has a gas inlet, and the second microwave resonant chamber has a gas outlet.

19. An operation method of the hybrid plasma source, characterized in that a microwave electric field is used to cause a working gas form a plasma in the hybrid plasma source as claimed in claim 1, and then a transformer coupled plasma technique is used to couple energy to the plasma with high efficiency, so that a plasma density of the plasma is further increased to generate an activated gas with a high degree of dissociation.

* * * * *